(12) United States Patent
Del Monte

(10) Patent No.: US 9,013,612 B2
(45) Date of Patent: Apr. 21, 2015

(54) IMAGE SENSORS WITH ANTIREFLECTIVE LAYERS

(75) Inventor: Andrea Del Monte, Pomezia (IT)

(73) Assignee: Semiconductor Components Industries, LLC, Phoenix, AZ (US)

( * ) Notice: Subject to any disclaimer, the term of this patent is extended or adjusted under 35 U.S.C. 154(b) by 725 days.

(21) Appl. No.: 12/860,610

(22) Filed: Aug. 20, 2010

(65) Prior Publication Data

US 2012/0044395 A1  Feb. 23, 2012

(51) Int. Cl.
- *H04N 3/14* (2006.01)
- *H04N 5/225* (2006.01)
- *H01L 27/146* (2006.01)

(52) U.S. Cl.
CPC ..... *H01L 27/14629* (2013.01); *H01L 27/14621* (2013.01); *H01L 27/14627* (2013.01)

(58) Field of Classification Search
None
See application file for complete search history.

(56) References Cited

U.S. PATENT DOCUMENTS

| | | | |
|---|---|---|---|
| 6,369,417 B1 | 4/2002 | Lee | |
| 6,396,089 B1 | 5/2002 | Lin et al. | |
| 6,482,669 B1 * | 11/2002 | Fan et al. | 438/70 |
| 6,909,162 B2 | 6/2005 | Wu et al. | |
| 7,595,217 B2 | 9/2009 | Choi | |
| 7,611,921 B2 | 11/2009 | Kim | |
| 7,709,872 B2 * | 5/2010 | Shiau et al. | 257/294 |
| 7,750,280 B2 | 7/2010 | Hwang et al. | |
| 2006/0076590 A1 * | 4/2006 | Pain et al. | 257/294 |
| 2006/0145197 A1 | 7/2006 | Baek | |
| 2006/0157733 A1 * | 7/2006 | Lucovsky et al. | 257/192 |
| 2006/0220025 A1 | 10/2006 | Oh | |
| 2007/0158696 A1 * | 7/2007 | Palsule et al. | 257/233 |
| 2008/0122023 A1 | 5/2008 | Lee | |
| 2008/0251873 A1 * | 10/2008 | Kasano et al. | 257/432 |
| 2009/0230394 A1 * | 9/2009 | Nagaraja et al. | 257/59 |
| 2010/0059840 A1 * | 3/2010 | Yun | 257/432 |
| 2010/0308214 A1 * | 12/2010 | Wober | 250/227.11 |
| 2010/0311243 A1 * | 12/2010 | Mao | 438/694 |
| 2011/0136288 A1 * | 6/2011 | Duane et al. | 438/59 |
| 2011/0217807 A1 * | 9/2011 | Nagaraja et al. | 438/70 |
| 2011/0223707 A1 * | 9/2011 | Hynecek et al. | 438/70 |
| 2012/0028373 A1 * | 2/2012 | Belen et al. | 438/3 |
| 2013/0033629 A1 * | 2/2013 | Zheng et al. | 348/294 |

OTHER PUBLICATIONS

Andrea Del Monte, U.S. Appl. No. 12/831,552, filed Jul. 2, 2010.

* cited by examiner

*Primary Examiner* — Lin Ye
*Assistant Examiner* — John H Morehead, III
(74) *Attorney, Agent, or Firm* — Treyz Law Group; Kendall P. Woodruff

(57) ABSTRACT

An electronic device may have an image sensor array that captures images. The image sensor array may include antireflective layers that increase the efficiency of the image sensor in gathering incoming light. The image sensor array may include a first antireflective layer between a color filter layer and a passivation layer and a second antireflective layer between the passivation layer and a dielectric stack. The first antireflective layer may have an index of refraction that is between the indexes of refraction of the color filter layer and the passivation layer and the second antireflective layer may have an index of refraction that is between the indexes of refraction of the dielectric stack and the passivation layer, thereby reducing the proportion of incident light that reflects off the interface between the color filter layer and the passivation layer and the interface between the passivation layer and the dielectric stack.

18 Claims, 3 Drawing Sheets

IMAGE SENSORS WITH ANTIREFLECTIVE LAYERS

BACKGROUND

This relates to imaging systems and, more particularly, to image sensors with antireflective layers.

Digital cameras are often provided with digital image sensors such as CMOS (complementary metal-oxide-semiconductor) image sensors. Digital cameras may be stand-alone devices or may be included in electronic devices such as cellular telephones or computers. A typical CMOS image sensor has an array of image sensing pixels containing contain thousands or millions of pixels. Lenses focus incoming light onto the array of pixels. Layers such as a dielectric stack, a passivation layer, and a color filter layer may be located between the lenses and the image sensing pixels. Metal interconnects and vias are formed in the metal and dielectric layers of the dielectric stack. The passivation layer can be formed above the dielectric stack. The color filter layer contains filters for filtering light of different colors.

Image sensor performance is influenced by the efficiency with which image sensor pixels gather incoming light. In conventional image sensors, some of the incoming light is reflected away from the pixels at the interface between the color filter array and the passivation layer and at the interface between the passivation layer and the dielectric stack, thereby reducing the performance of the image sensors.

It would therefore be desirable to provide improved image sensors with increased efficiency of gathering incoming light.

DETAILED DESCRIPTION

Figure 1:
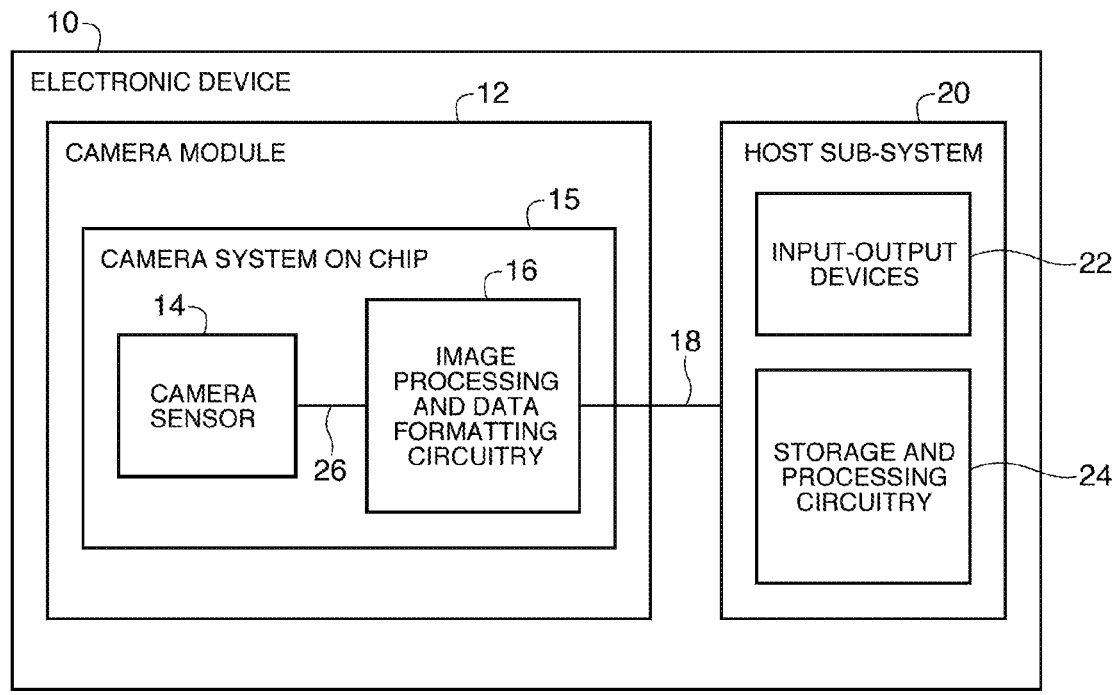
FIG. 1 is a diagram of an illustrative electronic device that may include a camera module and host subsystem in accordance with an embodiment of the present invention.

An electronic device with a digital camera module is shown in FIG. 1. Electronic device 10 may be a digital camera, a computer, a cellular telephone, a medical device, or other electronic device. Camera module 12 may include image sensor 14 and one or more lenses. During operation, the lenses focus light onto image sensor 14. Image sensor 14 includes an array of photosensitive elements (i.e., pixels) that convert the light into digital data. Image sensors may have any number of pixels (e.g., hundreds, thousands, millions, or more). A typical image sensor may, for example, have millions of pixels (e.g., megapixels).

Still and video image data from camera sensor 14 may be provided to image processing and data formatting circuitry 16 via path 26. Image processing and data formatting circuitry 16 may be used to perform image processing functions such as data formatting, adjusting white balance and exposure, implementing video image stabilization, face detection, etc. Image processing and data formatting circuitry 16 may also be used to compress raw camera image files if desired (e.g., to Joint Photographic Experts Group or JPEG format). In a typical arrangement, which is sometimes referred to as a system on chip or SOC arrangement, camera sensor 14 and image processing and data formatting circuitry 16 are implemented on a common integrated circuit 15. The use of a single integrated circuit to implement camera sensor 14 and image processing and data formatting circuitry 16 can help to minimize costs.

Camera module 12 (e.g., image processing and data formatting circuitry 16) conveys acquired image data to host subsystem 20 over path 18. Electronic device 10 typically provides a user with numerous high-level functions. In a computer or advanced cellular telephone, for example, a user may be provided with the ability to run user applications. To implement these functions, host subsystem 20 of electronic device 10 may have input-output devices 22 such as keypads, input-output ports, joysticks, and displays and storage and processing circuitry 24. Storage and processing circuitry 24 may include volatile and nonvolatile memory (e.g., random-access memory, flash memory, hard drives, solid state drives, etc.). Storage and processing circuitry 24 may also include microprocessors, microcontrollers, digital signal processors, application specific integrated circuits, etc.

The quality of the images that are captured by image sensor 14 is influenced by a variety of factors. For example, the quality of the lens that is used to focus image light onto the image sensor may have an impact on image quality. The size of the pixel array in image sensor 14 and the size of the individual pixels in image sensor 14 may also have an impact on image quality. Image sensors with large numbers of image pixels will generally be able to produce images with higher quality or resolution than smaller image sensors having fewer image pixels. Increasing the size of individual pixels in an image sensor will generally increase the performance of the image sensor when capturing dimly lit scenes and when capturing an image with a relatively short exposure time, as examples. Image quality is also affected by the performance of the individual pixels in the image array. Image arrays with poorly designed image pixels will not be efficient at collecting light and converting the collected light into electrical signals.

Figure 2:
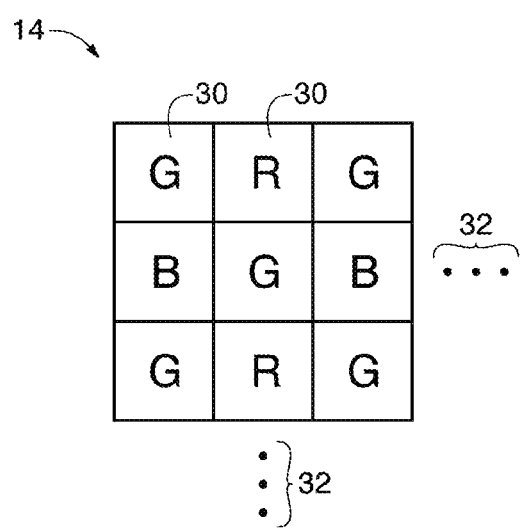
FIG. 2 is a diagram of an illustrative color filter array having a Bayer pattern that may be included in an image sensor array in accordance with an embodiment of the present invention.

An illustrative image sensor array 14 is shown in FIG. 2. As shown in FIG. 2, sensor 14 has an array of image pixels 30. Pixels 30 are typically organized in rows and columns. Each pixel contains a photosensitive element such as a photodiode and corresponding electrical components (e.g., transistors, charge storage elements, and interconnect lines for routing electrical signals). A typical pixel may include a color filter that is part of a color filter array and, if desired, a microlens. The microlens in a pixel 30 may receive light from a primary lens in electronic device 10 and focus the light onto a photosensitive element in the pixel through the color filter of the pixel. There are typically color filter elements of several different colors in a color filter array. Each color filter element may be associated with a single pixel 30, as an example. Image sensors such as in the example of FIG. 2 that are based on the well-known Bayer color filter array pattern contain red (R), green (G), and blue (B) color filters. Pixels having such color filters may be known as red pixels, green pixels, and blue pixels, respectively. In a Bayer pattern, half of the rows (e.g., the odd rows) contain alternating green (G) and red (R) color filters and the other half of the rows (e.g., the even rows) contain alternating green and blue (B) color filters. Only nine pixels are shown in the example of FIG. 2, but in general, pixel array 14 may have millions of pixels, as denoted by dots 32.

Figure 3:
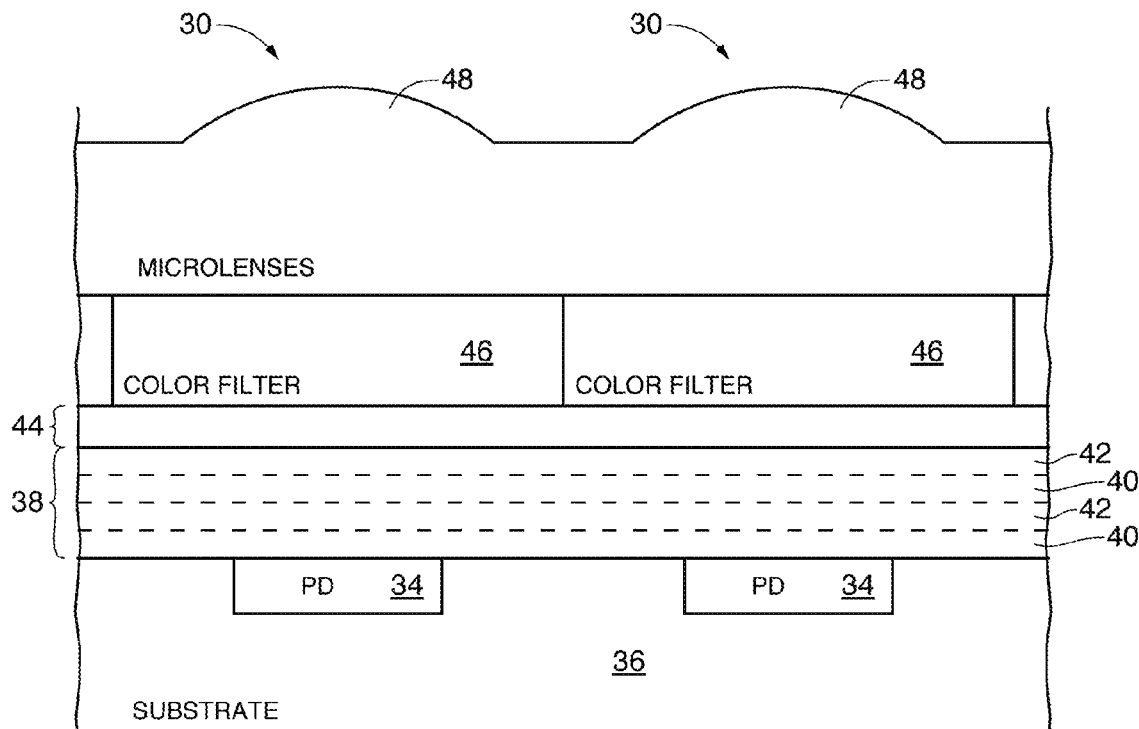
FIG. 3 is a cross sectional diagram of an illustrative image sensor that may include a passivation layer between a color filter array layer and dielectric stack layers in accordance with an embodiment of the present invention.

FIG. 3 is a cross-sectional diagram of an image sensor such as image sensor 14 of FIG. 1 that includes an array of image pixels. As shown in FIG. 3, image sensor 14 may be formed on an integrated circuit. Image sensor pixels 30 of FIG. 3 may be formed on semiconductor substrates such as silicon wafers. Pixels 30 may have photosensitive elements 34 (photodiodes) that are formed in substrate 36.

Dielectric stack 38 may be formed above photodiodes 34 in substrate 36. Dielectric stack 38 may include dielectric material such as silicon oxide or tetra ethyl oxysilan and may include alternating metal layers 40 and via layers 42. Metal interconnect lines can be formed in metal layers 40. Via layers 42 may include conductive vertical conductors (vias) that electrically connect metal interconnects in adjacent metal layers. The patterns of metal lines in metal layers 40 and via layers 42 in dielectric stack 38 can be configured so as not to significantly impede light that is being focused onto photosensitive elements 34 (e.g., metal lines may be concentrated in areas that do not impede light that is being focused onto photosensitive elements 34 such as at the edges of each pixel 30).

A passivation layer 44 may be formed at the top of dielectric stack 38. Passivation layer 44 may be formed from a layer of silicon nitride, as an example. Passivation layer 44 may isolate elements of pixels 30 such as dielectric stack 24 and photosensitive element 34 from the external environment. Layer 44 may provide an electrical isolation that helps to increase the performance of the pixels 30 and may provide a physical isolation that protects pixels 30 from moisture and other environmental factors.

Color filters 46 may be formed on top of passivation layer 44. Color filters 46 may filter light of specific wavelengths. In a Bayer pattern filter array, color filters 46 may be include red, blue, and green filters (with each filter 46 being either a red, blue, or green filter).

Microlenses 48 may be formed above color filters 46. During operation of the image sensor, incoming light may be focused by each microlens 48 onto the surface of a corresponding photosensitive element 34. Microlenses 48 may be formed from polymer, as an example.

Because the index of refraction of color filters 46 may be different from the index of refraction of passivation layer 44, incident light may be reflected away from photosensitive elements 34 when a portion of the incident light reflects off the boundary between color filter array 46 and passivation layer 44. Similarly, because the index of refraction of passivation layer 44 may be different from the index of refraction of dielectric stack 38 (e.g., the uppermost metal layer or via layer that is adjacent to passivation layer 44), incident light may be reflected away from photosensitive elements 34 when a portion of the incident light reflects off the boundary between passivation layer 44 and dielectric stack 38. The performance of image sensor 14 may be improved by providing one or more antireflective layers, as shown in FIG. 4, to increase the proportion of incoming light that passes through color filters 46 (e.g., a color filter array in sensor 14), passivation layer 44, and dielectric stack 38 without reflecting away from the photosensitive elements 34.

Figure 4:
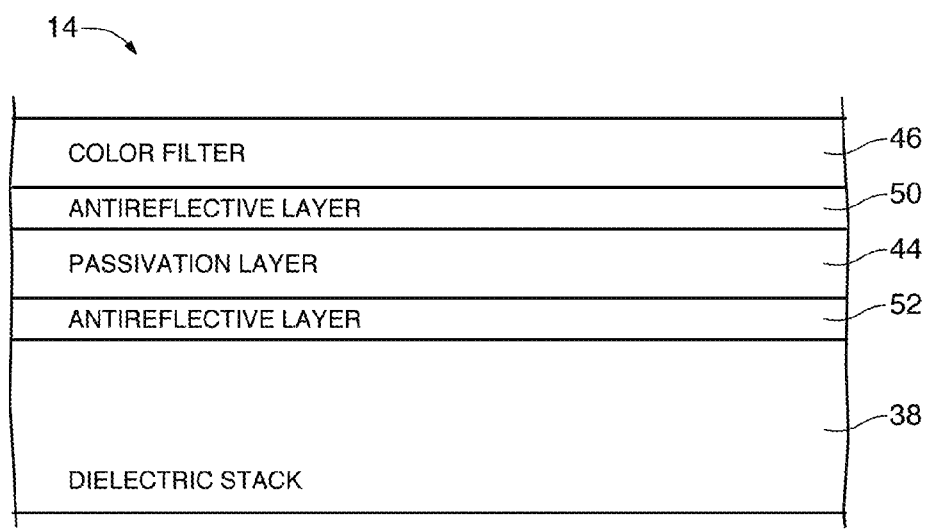
FIG. 4 is a cross sectional diagram of an illustrative image sensor that may include a passivation layer between a color filter array layer and dielectric stack layers, that may include an antireflective layer between the color filter array layer and the passivation layer, and that may include an antireflective layer between the passivation layer and the dielectric stack layers in accordance with an embodiment of the present invention.

As shown in the cross-sectional diagram of FIG. 4, image sensor 14 may include antireflective layers such as layers 50 and 52 and image sensor 14 may be formed on an integrated circuit (e.g., sensor 14 may be an image sensor integrated circuit). In general, image sensor 14 may include only one of layers 50 and 52 or may include both layers 50 and 52. Antireflective layers such as layers 50 and 52 may sometimes be referred to herein as antireflection layers. Antireflective layer 50 may have an index of refraction that is between the index of refraction of color filter 46 and passivation layer 44, to increase the transmittance of light passing between layers 46 and 44 (e.g., to decrease the proportion of incident light reflected away from dielectric stack 38 at the boundary between layers 46 and 44). Similarly, antireflective layer 52 may have an index of refraction that is between the index of refraction of passivation layer 44 and dielectric stack 38, to increase the transmittance of light passing between layer 44 and dielectric stack 38 (e.g., to decrease the proportion of incident light reflected away from dielectric stack 38 at the boundary between layer 44 and dielectric stack 38). Antireflective layers such as layers 50 and 52 may, if desired, be formed from an oxynitride such as silicon oxynitride.

Antireflective layers 50 and 52 may have any thickness and index of refraction. As one example, antireflective layers 50 and 52 may be formed using a deposition process such as plasma-enhanced chemical vapor deposition process (PEVCD process). With this type of arrangement, the thickness and index of refraction of an antireflective layer such as one of layers 50 and 52 can be independently controlled. The thickness of layers 50 and 52 can be controlled by varying the duration of deposition time in the PEVCD process. The indexes of refraction of layers 50 and 52 can be controlled by varying the gases used in the PEVCD process, by varying the proportions of those gases, and by varying voltage and frequency levels used in the PEVCD process (e.g., higher index of refraction antireflective layers may be formed using higher power levels and lower index of refraction antireflective layers may be formed using lower power levels). As an example, antireflective layers 50 and 52 may have a thickness that is less than 50 nanometers, between approximately 50 and 80 nanometers, or greater than 80 nanometers.

Color filter array layer 46 may have any thickness and index of refraction. As an example, color filter array layer 46 may have a thickness of approximately 1.0 micrometer. The index of refraction of color filter array 46 may vary between the various types of filters in array 46 (e.g., the index of refraction of green filters may be different from the indexes of refraction of red and blue filters and the index of refraction of red filters may be different from the index of refraction of blue filters). As examples, green filters in array 46 may have an index of refraction of less than 1.6, approximately 1.6, approximately 1.7, approximately 1.8, or greater than 1.8. Red and blue filters in array 46 may have similar indexes of refraction. Typically, red filters may have an index of refraction that is slightly lower than the index of refraction of green filters and blue filters may have an index of refraction that is slightly higher than the index of refraction of green filters.

Passivation layer 44 may have any thickness and index of refraction. As an example, passivation layer 44 may have a thickness of approximately 200 nanometers. As examples, passivation layer 44 may have an index of refraction of less than 1.8, approximately 1.8, approximately 1.9, approximately 2, approximately 2.1, or greater than 2.2 (e.g., at green wavelengths such as wavelengths of approximately 550 nanometers).

Dielectric stack 38 may have any thickness and index of refraction. As an example, dielectric stack 38 may have a thickness of approximately 1.0 micrometer. As examples, dielectric stack 38 may have an index of refraction of less than 1.4, approximately 1.4, approximately 1.46, approximately 1.5, approximately 1.5, or greater than 1.5 (e.g., at green wavelengths such as wavelengths of approximately 550 nanometers).

The index of refraction of antireflective layer 50 may be selected to be between the index of refraction of color filter array 46 and passivation layer 44. As one example, the index of refraction of antireflective layer 50 may be selected based on the index of refraction of green filters in color filter array layer 46, because of the relative importance of green pixels in Bayer pattern imaging (e.g., because green pixels provide a relatively large proportion of the resolution of an image captured with Bayer pattern color filter array). If desired, the index of refraction of antireflective layer 50 may be selected to be approximately equal to the square root of the index of refraction of filter layer 46 times the index of refraction of passivation layer 44 (e.g., when the indexes of refraction of layers 46 and 44 are approximately 1.7 and 2.0, respectively, the index of refraction of layer 50 may be approximately 1.84).

The index of refraction of antireflective layer 52 may be selected to be between the index of refraction of passivation layer 44 and dielectric stack 38. As one example, the index of refraction of antireflective layer 52 may be selected to be approximately equal to the square root of the index of refraction of passivation layer 44 times the index of refraction of dielectric stack layers 38 (e.g., when the indexes of refraction of layers 44 and 38 are approximately 2.0 and 1.46, respectively, the index of refraction of layer 52 may be approximately 1.71).

Figure 5:
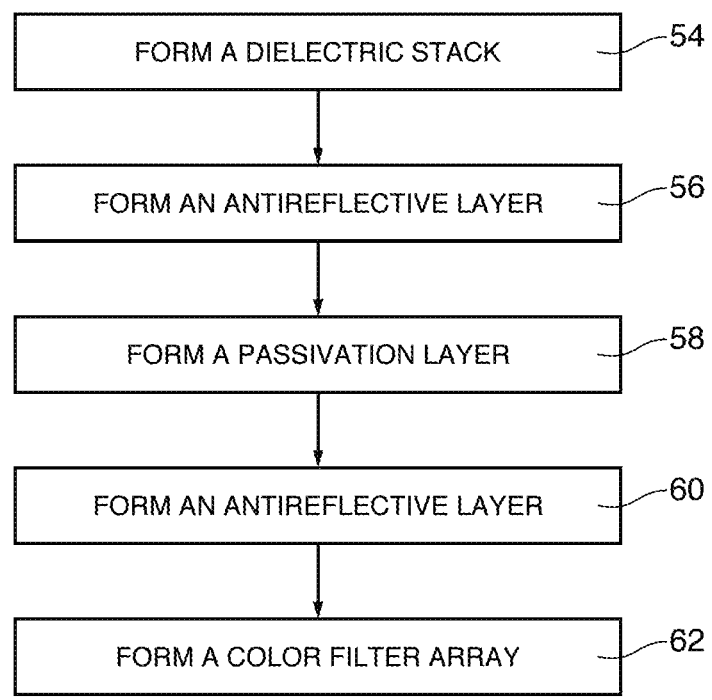
FIG. 5 is a flow chart of illustrative steps involved in forming an image sensor of the type shown in FIG. 4 in accordance with an embodiment of the present invention.

A flow chart of illustrative steps involved in forming an image sensor such as image sensor 14 of FIG. 4 is shown in FIG. 5. The steps described in connection with FIG. 5 may be associated with an integrated circuit fabrication process such as a complementary metal-oxide-semiconductor (CMOS) process.

In step 54, dielectric stack 38 may be formed. As part of step 54, structures such as substrate 36, photosensitive devices 34 and other transistors in substrate 36 (e.g., reset transistors, transfer transistors, source-follower transistors, address transistors sometimes referred to as row select transistors, etc.) may be formed. Forming dielectric stack 38 may include forming metal lines in the dielectric of metal layers 40 and vias (i.e., vertical via lines) in the dielectric of via layers 42, as examples. If desired, metal lines and vias in layers 40 and 42 may be located in locations that do not interfere with incident light passing from the external environment to photosensitive devices 34 (e.g., the metal lines and vias may be concentrated on the perimeter of each pixel 30).

In optional step 56, antireflective layer 52 may be formed. Antireflective layer 52 may be formed on dielectric stack 38, as an example. Antireflective 52 layer may be formed to have an index of refraction that is between the index of refraction of passivation layer 44 and dielectric stack 38.

In step 58, passivation layer 44 may be formed. Passivation layer 44 may be formed on antireflective layer 52, when antireflective layer 52 is formed in step 56, or may be formed on dielectric stack 38, when antireflective layer 52 is not formed, as examples.

In optional step 60, antireflective layer 50 may be formed. Antireflective layer 50 may be formed on passivation layer 44, as an example. Antireflective layer 50 may be formed to have an index of refraction that is between the index of refraction of passivation layer 44 and color filter array layer 46.

In step 62, color filter array layer 46 may be formed. Color filter array layer 46 may be formed on antireflective layer 50, when antireflective layer 50 is formed in step 60, or may be formed on passivation layer 44, when antireflective layer 50 is not formed, as examples.

Various embodiments have been described illustrating image sensors with antireflective layers.

An electronic device may have an image sensor array that captures images. The image sensor array may include antireflective layers that increase the efficiency of the image sensor in gathering incoming light. The image sensor array may include a first antireflective layer between a color filter layer and a passivation layer and a second antireflective layer between the passivation layer and a dielectric stack. The first antireflective layer may have an index of refraction that is between the indexes of refraction of the color filter layer and the passivation layer and the second antireflective layer may have an index of refraction that is between the indexes of refraction of the dielectric stack and the passivation layer, thereby reducing the proportion of incident light that reflects off the interface between the color filter layer and the passivation layer and the interface between the passivation layer and the dielectric stack.

The foregoing is merely illustrative of the principles of this invention which can be practiced in other embodiments.

What is claimed is:

1. An image sensor, comprising:
a layer of photosensitive devices;
dielectric stack layers that include at least one metal layer with metal lines and at least one via layer with vias and that are formed above the layer of photosensitive devices, wherein the dielectric stack layers cover the photosensitive devices;
a first antireflective layer that is formed on the dielectric stack layers;
a passivation layer that is formed above the first antireflective layer;
a second antireflective layer that is formed above the passivation layer; and
a color filter array layer that is formed above the second antireflective layer, wherein the dielectric stack layers have a first index of refraction, wherein the passivation layer has a second index of refraction that is different than the first index of refraction, and wherein the first antireflective layer has a third index of refraction that is between the first and second indices of refraction.

2. The image sensor defined in claim 1 wherein the color filter array layer comprises a plurality of red filters, a plurality of green filters, and a plurality of blue filters.

3. The image sensor defined in claim 1 wherein the color filter array layer comprises a plurality of filters, each of which is associated with and located above a respective one of the photosensitive devices.

4. The image sensor defined in claim 1 further comprising a substrate in which the photosensitive devices are formed, wherein the dielectric stack layers are formed on the substrate.

5. The image sensor defined in claim 1 further comprising a layer of lenses that is formed above the color filter array.

6. The image sensor defined in claim 5 wherein the color filter array layer comprises a plurality of filters, each of which is associated with and located above a respective one of the photosensitive devices and wherein the layer of lenses comprises a plurality of lenses, each of which is associated with and located above a respective one of filters in the color filter array layer.

7. The image sensor defined in claim 1 wherein the color filter array layer has a fourth index of refraction that is different than the second index of refraction, and wherein the second antireflective layer has a fifth index of refraction that is between the second and fourth indices of refraction.

8. The image sensor defined in claim 1 wherein first and second antireflective layers comprise silicon oxynitride.

9. The image sensor defined in claim 1 wherein the dielectric stack layers comprise silicon oxide.

10. The image sensor defined in claim 1 wherein the passivation layer comprises silicon nitride.

11. An integrated circuit, comprising:
   a passivation layer between a layer of photosensitive devices and a layer of lenses;
   an antireflective layer adjacent to the passivation layer, wherein the antireflective layer is interposed between the passivation layer and the layer of photosensitive devices;
   dielectric stack layers that include at least one metal layer with metal lines and at last one via layer with vias and that is formed above the layer of photosensitive devices, wherein the dielectric stack layers are interposed between the antireflective layer and the photosensitive devices, wherein the dielectric stack layers have a first index of refraction, wherein the passivation layer has a second index of refraction that is different than the first index of refraction, and wherein the antireflective layer has a third index of refraction that is between the first and second indices of refraction.

12. The integrated circuit defined in claim 11 further comprising:
   a color filter array layer that is formed above the passivation layer.

13. The integrated circuit defined in claim 12 wherein the antireflective layer is a first antireflective layer, the integrated circuit further comprising:
   a second antireflective layer that is between the passivation layer and the color filter array layer and that is adjacent to the passivation layer.

14. The integrated circuit defined in claim 13 wherein the layer of lenses comprises a layer of microlenses, each of which is associated with and located above a respective one of the photosensitive devices.

15. The integrated circuit defined in claim 13 wherein the color filter array layer comprises a plurality of filters, each of which is associated with and located above a respective one of the photosensitive devices.

16. A method of forming an image sensor, comprising:
   forming a dielectric stack above photosensitive devices;
   forming a color filter array above the dielectric stack, wherein the dielectric stack is interposed between the color filter array and the photosensitive devices, and wherein the dielectric stack covers the photosensitive devices;
   forming a passivation layer between the color filter array and the dielectric stack; and
   forming at least one antireflective layer adjacent to the passivation layer, wherein the dielectric stack has a first index of refraction, wherein the passivation layer has a second index of refraction that is different than the first index of refraction, and wherein the at least one antireflective layer has a third index of refraction that is between the first and second indices of refraction.

17. The method defined in claim 16 wherein forming the least one antireflective layer adjacent to the passivation layer comprises:
   forming a first antireflective layer between the dielectric stack and the passivation layer; and
   forming a second antireflective layer between the passivation layer and the color filter array.

18. The method defined in claim 16 wherein the color filter array has a fourth index of refraction that is different than the second index of refraction, and wherein forming the least one antireflective layer adjacent to the passivation layer comprises:
   forming a first antireflective layer that is between the dielectric stack and the passivation layer and that has the third index of refraction that is between the first and second indices of refraction; and
   forming a second antireflective layer that is between the passivation layer and the color filter array and that has a fifth index of refraction that is between the second and fourth indices of refraction.

\* \* \* \* \*